(12) United States Patent
Fujishima et al.

(10) Patent No.: US 6,350,389 B1
(45) Date of Patent: Feb. 26, 2002

(54) METHOD FOR PRODUCING POROUS DIAMOND

(75) Inventors: Akira Fujishima, Kawasaki; Hideki Masuda, Hachioji, both of (JP)

(73) Assignee: The University of Tokyo, Tokyo (JP)

( * ) Notice: Subject to any disclaimer, the term of this patent is extended or adjusted under 35 U.S.C. 154(b) by 0 days.

(21) Appl. No.: 09/276,907

(22) Filed: Mar. 26, 1999

(30) Foreign Application Priority Data

Jun. 12, 1998 (JP) ............................................. 10-164770

(51) Int. Cl.⁷ ................................................. B31D 3/00
(52) U.S. Cl. ............................ 216/56; 216/59; 216/30; 427/156; 427/259; 156/345
(58) Field of Search ........................ 156/345; 427/156; 252/79.1; 216/30, 56, 59

(56) References Cited

U.S. PATENT DOCUMENTS 4,957,591 A    9/1990  Sato et al. ................... 156/643
5,844,252 A   12/1998  Shiomi et al. ................. 257/10
6,045,677 A *  4/2000  Beetz et al. ................... 205/50

FOREIGN PATENT DOCUMENTS

| JP | A-63-34927 | 2/1988 |
| JP | A-1-246116 | 2/1989 |
| JP | A-7-202164 | 8/1995 |
| WO | WO98/09005 | * 3/1998 |

* cited by examiner

Primary Examiner—Frankie L. Stinson
Assistant Examiner—M. Kornakov
(74) Attorney, Agent, or Firm—Venable; Marina V. Schneller

(57) ABSTRACT

A method for producing a porous diamond according to the present invention comprises steps of forming an anodized alumina layer, which functions as a mask, on a diamond substrate; and performing a plasma etching treatment to form pores on the diamond substrate, which pores have the same arrangement as those of the anodized alumina mask.

8 Claims, 4 Drawing Sheets

METHOD FOR PRODUCING POROUS DIAMOND

BACKGROUND OF THE INVENTION

1. Field of the Invention

The present invention relates to a method for producing a porous diamond.

2. Description of the Related Art

Porous diamonds have been used in dies for drawing, sensors, electrode materials and the like, and such porous diamonds have been conventionally produced by a method in which an etching-resistant mask is formed on a diamond substrate through a resist application and exposure patterning; and then a selective etching is conducted by a dry etching method. An alternative known method, which may be used to form more minute patterns on a diamond substrate, is to draw a pattern using an electric beam instead of exposure patterning; this is followed by a dry etching treatment.

In addition to the above conventional methods, a processing method for diamonds in which a high intensity laser beam is projected onto a diamond substrate so that part of the diamond is evaporated and vaporized is also known.

However, the conventional method in which a pattern is transferred using a resist and exposure patterning is limited as to minuteness of detail, due to the diffraction limit of light. Further, in the electric beam depiction method, which can draw more minute patterns compared to the optical transferring method, drawing of a pattern requires a longer time, thereby causing a significant increase in the total cost. Moreover, all conventional patterning methods wherein a resist is used commonly require rather complicated steps of application of a resist, drawing of pattern, and removal of the resist. In addition, since the aspect ratio (depth of pore/opening diameter of pore) of the resist patterns formed in the convention methods is small, there is a problem in that it is difficult to process a structure having a large aspect ratio during subsequent dry etching.

Even in a method using a laser beam which does not require the complicated steps like application of resist, the resolution of the process is also restricted to about 1 micron because of the diameter of the laser beam.

SUMMARY OF THE INVENTION

It is, therefore, an object of the present invention to provide a method for producing a porous diamond having fine pores of high density without including such complicated steps as those that are necessary for the above-mentioned conventional methods.

To accomplish the above-mentioned object, there is provided according to the present invention, a method for producing a porous diamond comprising steps of: forming an anodized alumina layer, which functions as a mask, on a diamond substrate; and performing a plasma etching treatment to form pores on the diamond substrate, which pores having the same arrangement as those of the anodized alumina mask. More specifically, in the method according to the present invention, a mask of anodized alumina having a number of minute through holes which are orthogonal to the surface thereof is formed on a diamond substrate, and then a plasma etching treatment is performed to process the surface of the diamond substrate in such a manner that the ordered structure of the mask is transferred onto the surface of the diamond substrate. The term "through holes" refers to holes that go all the way through a substance, for example, an anodized alumina layer.

An inert gas, like argon, as well as a gas including oxygen, can be effectively used as a gas for etching in the method according to the claimed invention. The porous structure formed on a diamond substrate by a method according to the present invention depends on the form of anodized alumina used as a mask. It is known that anodized alumina has pores (i.e., through holes) of a uniform diameter which is within a range from 10 nm to 400 nm, and such diameter can be controlled by controlling conditions for anodic oxidation (anodization) and a process of post-treatment. Further, by selectively etching the bottom portion of an anodized alumina film which is called a barrier layer, the anodized alumina film can be formed into a thin film having through holes [H. Masuda and M. Satho, Japanese Journal of Applied Physics, vol. 35 P.L126 (1996)].

With the method according to the present invention, as described above, minute processing can be performed on a diamond substrate without requiring additional steps such as application of a resist, exposure to light, or removal of the applied resist.

BRIEF DESCRIPTION OF THE DRAWINGS

The present invention will be explained in further detail with reference to the attached drawings.

FIG. 4(a) is a diagram schematically showing a plasma electrode to be placed in a plasma etching container; and FIG. 4(b), illustrates a plasma electrode with a substrate and an anodized alumina layer place thereon.

DETAILED DESCRIPTION OF THE PREFERRED EMBODIMENTS

Now, a preferred embodiment of the present invention will be described in detail by referring to the attached drawings.

Figure 1:
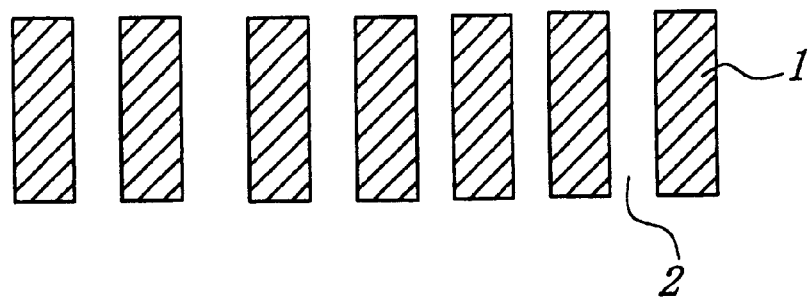
FIG. 1 is a cross-sectional view showing an anodized alumina layer which is used as a mask in a method according to the present invention.
Figure 2:
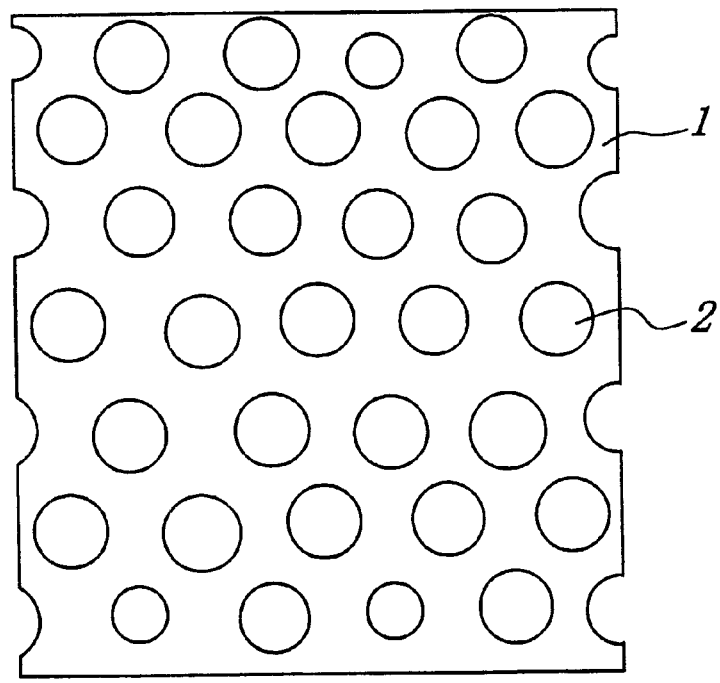
FIG. 2 is a plan view illustrating the arrangement of pores in an anodized alumina.

FIG. 1 shows a layer of porous anodized alumina 1 which is used as a mask for etching in a preferred embodiment of the method according to the present invention. Such anodized alumina has pores 2 which are arranged in hexagonal close-packed arrangement, as schematically illustrated in FIG. 2, and the diameter of such pores and the inter-pore distances can be regulated by controlling conditions for anodic oxidation (anodization) and a post-treatment. When an anodized alumina layer is formed under ordinary conditions, pores of the thus-obtained anodized alumina have diameters within a range of 5 nm–400 nm and inter-pore distances within a range of 100 nm–500 nm, and such anodized alumina can be effectively used in a preferred embodiment of the present invention. Further, it is desirable for the thickness of the anodized alumina to be within the range of 0.1–1 $\mu$m.

Figure 3:
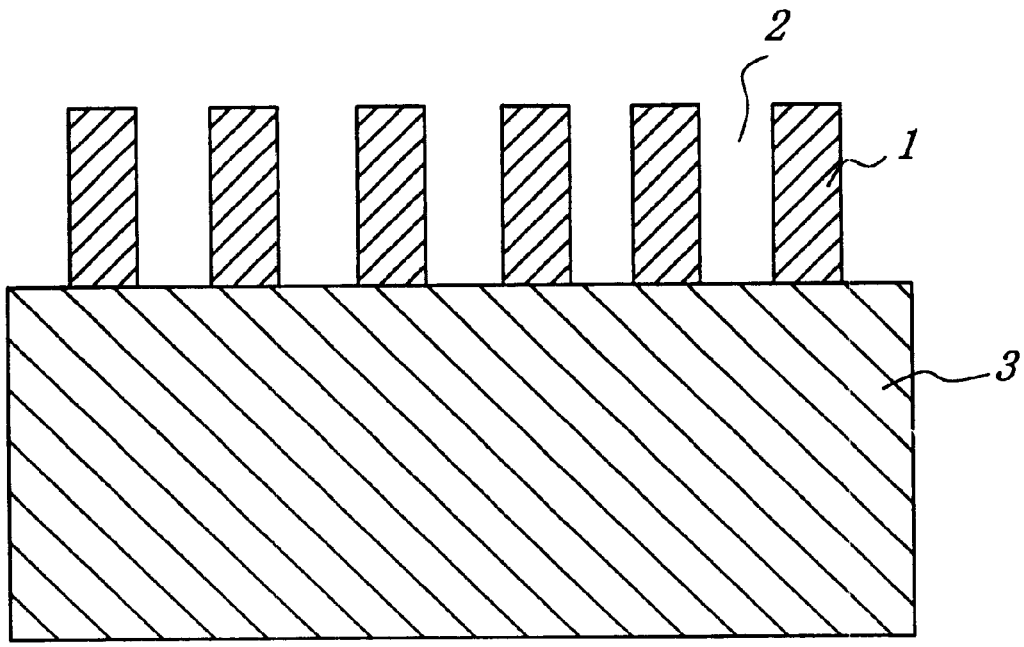
FIG. 3 is a cross-sectional view depicting a diamond substrate on which the mask shown in FIG. 1 is formed.

FIG. 3 shows a diamond substrate 3 on which a layer of anodized alumina 1 has been formed for use as a mask for etching. A natural diamond, as well as a synthesized single-crystalline or polycrystalline diamond, can be adequately used as a substrate in a preferred embodiment of the present invention. These diamonds are subjected to a polishing process if necessary.

Figure 4A:
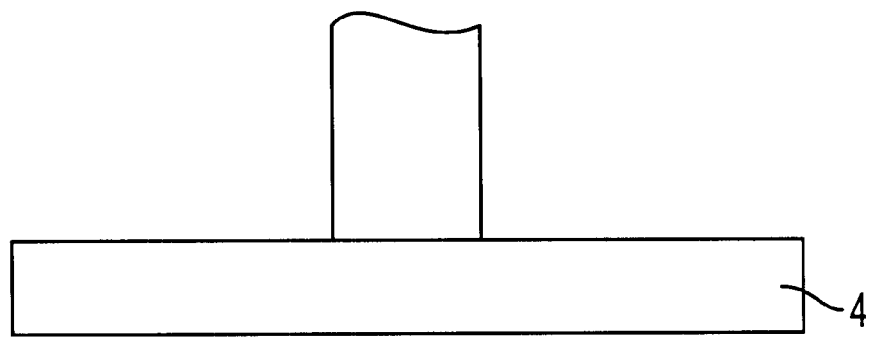
FIG. 4(a) and FIG. 4(b) are diagrams schematically showing the state of plasma etching within a plasma etching device.
Figure 4B:
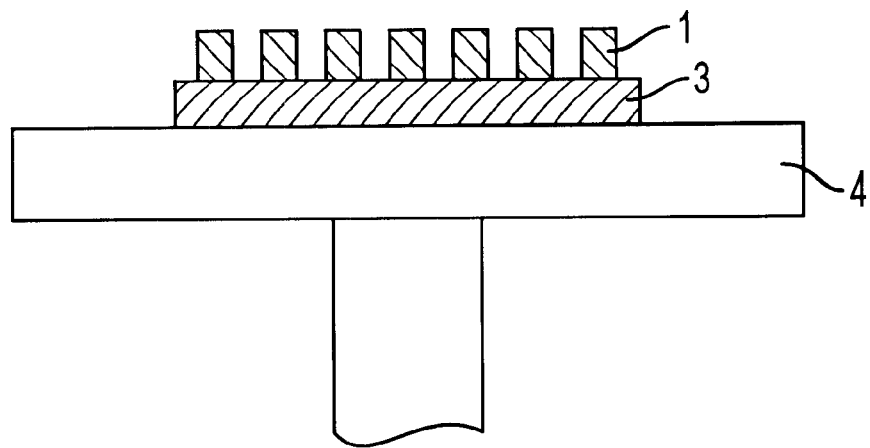

The diamond substrate 3 with a mask on the surface thereof is placed on a plasma electrode 4 in a plasma etching container as shown in FIG. 4, and activated-species excited by plasma reach the surface of the diamond substrate 3 through openings of the mask, that is, the pores thereof, thereby etching corresponding parts of the diamond substrate. Note that when oxygen is included in a gas for plasma excitation, the etching rate can be greatly increased.

Figure 5:
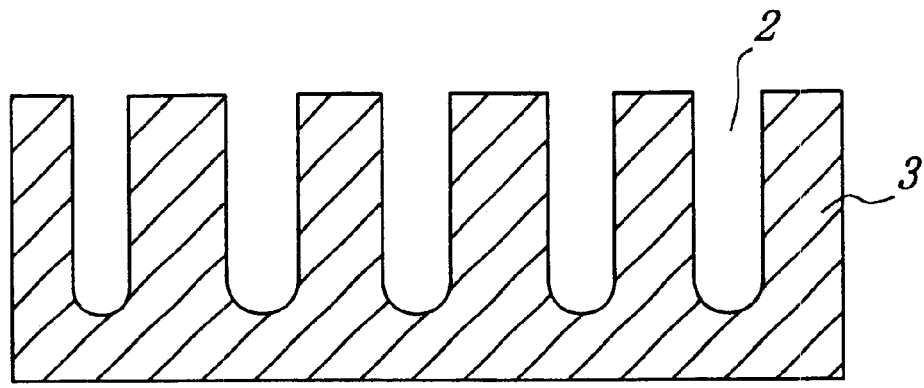
FIG. 5 is a cross-sectional view depicting a porous diamond which is produced by a method according to the present invention.
Figure 6:
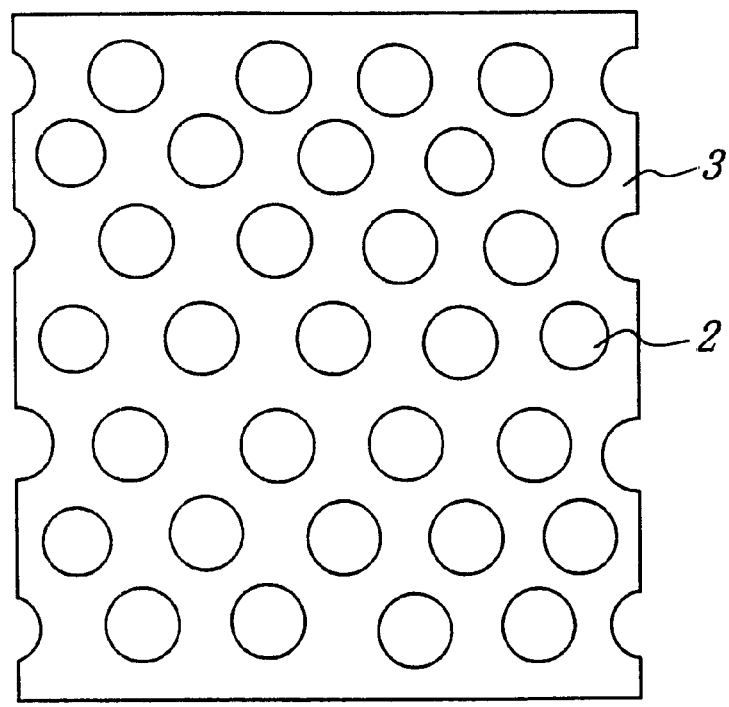
FIG. 6 is a plan view illustrating the arrangement of pores in a porous diamond which is produced by a method according to the present invention.

As shown in FIG. 5, the mask is then removed from the substrate 3 by dissolving it using a solution of sodium hydroxide or a like substance in which anodized alumina is soluble, and the result is a porous diamond having pores arranged in the same manner as those of the anodized alumina mask, as illustrated in FIG. 6.

The present invention will be explained in further detail in reference to specific examples. The following examples are given in illustration of the present invention and are not intended as limitations thereof.

EXAMPLE 1

A test piece of a diamond substrate which had been formed by a vapor growth method was subjected to surface polishing. Then, an anodized porous (alumina) film having through holes was placed on the diamond substrate as a mask for etching. The diameter of the through holes of the anodized porous (alumina) film and the inter-hole distance were respectively 70 nm and 100 nm, and the thickness of the film was 0.5 $\mu$m.

Next, the test piece of diamond substrate was placed on an electrode of a parallel plate type plasma etching apparatus such that the mask on the diamond substrate faced upward, and etching treatment was conducted for 10 minutes at a gas pressure of 1 Torr, an electric discharge frequency of 13.56 MHz, and an electric discharge input of 150 W. After the completion of etching, the anodized (alumina) film was removed by dissolving it using a 1 M sodium hydroxide solution. As a result, there was obtained a diamond substrate having a porous surface structure that was the same as the porous structure of the anodized (alumina) film. The depth of each pore was 1 $\mu$m.

EXAMPLE 2

An anodized alumina mask having a pore diameter of 20 nm, an inter-pore distance of 65 nm, and thickness of 0.5 $\mu$m was placed on a test piece of diamond substrate in the same manner as in Example 1. Then, plasma etching was performed in the same manner as in Example 1. As a result, there was obtained a porous diamond with pores having a diameter of 20 nm.

As described above, by the method according to the present invention, a porous diamond can be produced more swiftly and at a lower cost, in comparison to the conventional methods. In addition, even a porous diamond having very minute pores, which has been almost impossible to produce by the conventional lithography method, can be produced by the method according to the present invention. Furthermore, since an anodized porous alumina layer, which is used as a mask in the present invention, has pores (openings) of a large aspect ratio (depth of pore/diameter of pore), pores formed on a diamond substrate by etching using such a mask can have a larger aspect ratio than those formed using conventional methods.

Although the invention has been described with reference to specific preferred embodiments, they were given by way of examples only and thus, it should be noted that various changes and modifications may be made to them without departing from the scope of the present invention as defined by the appended claims.

What is claimed is:

1. A method for producing a porous diamond comprising the steps of:

producing an anodized alumina layer and disposing said layer on a diamond substrate; and performing a plasma etching treatment using said anodized alumina layer as a mask to form pores on said diamond substrate, said pores having the same arrangements a those of said anodized alumina mask and a characteristic aspect ratio, wherein the aspect ratio is defined as depth of pore/opening diameter of pore.

2. The method for producing a porous diamond as set forth in claim 1, wherein said plasma etching treatment is conducted in a gaseous atmosphere including oxygen.

3. The method for producing a porous diamond as set forth in claim 1, wherein said plasma etching treatment is conducted in a gaseous atmosphere including an inert gas.

4. The method for producing a porous diamond as set forth in claim 3, wherein said inert gas is argon.

5. The method for producing a porous diamond as set forth in claim 1, further comprising the step of:

removing said anodized alumina layer from said diamond substrate, following said plasma etching treatment.

6. The method for producing a porous diamond as set forth in claim 5, wherein said step of removing said anodized alumina layer comprises the step of:

dissolving said anodized alumina layer in a solution in which anodized alumina is soluble.

7. The method for producing a porous diamond as set forth in claim 6, wherein said solution in which anodized alumina is soluble is a solution of sodium hydroxide.

8. The method for producing a porous diamond as set forth in claim 1, further comprising the step of: .

controlling the diameters of the pores and the inter-pore distances of said anodized alumina layer.

* * * * *